US008885777B1

(12) United States Patent
Griffin et al.

(10) Patent No.: US 8,885,777 B1
(45) Date of Patent: Nov. 11, 2014

(54) DIGITAL SIGNAL PROCESSING APPARATUS WITH A DELAY MEMORY HAVING A PLURALITY OF MEMORY CELLS AND PROCESS FOR USING SAME

(71) Applicant: L-3 Communications Corp., New York, NY (US)

(72) Inventors: Dan M. Griffin, Salt Lake City, UT (US); David J. Moore, Salt Lake City, UT (US); Teren G. Jameson, Salt Lake City, UT (US)

(73) Assignee: L-3 Communications Corp, New York, NY (US)

( * ) Notice: Subject to any disclaimer, the term of this patent is extended or adjusted under 35 U.S.C. 154(b) by 100 days.

(21) Appl. No.: 13/659,887

(22) Filed: Oct. 24, 2012

(51) Int. Cl.
*H04L 27/06* (2006.01)
(52) U.S. Cl.
USPC ........... 375/340; 375/257; 375/295; 375/316; 375/297
(58) Field of Classification Search
CPC . H04L 25/067; H04L 1/0045; H04L 27/2647; H04L 1/005; H04L 1/0054
USPC ................. 375/224, 257, 295, 296, 297, 316; 365/191, 193, 194, 163
See application file for complete search history.

(56) References Cited

U.S. PATENT DOCUMENTS

| 6,061,406 A | 5/2000 | Carson et al. | |
|---|---|---|---|
| 8,630,129 B2 * | 1/2014 | Fujisawa et al. | 365/189.05 |
| 2013/0322190 A1 * | 12/2013 | Vikash et al. | 365/189.16 |

* cited by examiner

*Primary Examiner* — Dhaval Patel
(74) *Attorney, Agent, or Firm* — Kirton McConkie

(57) ABSTRACT

A digital signal processing (DSP) apparatus can be used to process a serial stream of digital signal samples of a plurality of "n" number of different signals. The DSP apparatus can include a DSP module configured to perform a DSP algorithm on digital signal samples of the signals. The DSP apparatus can have a delay memory with an "n" number of memory cells that each corresponding to one of the signals. The delay memory can also have a digital signal sample input connected to said initial input of said DSP module, a signal-number-in input, a signal-number-out input, and a digital signal sample output connected to said delay input of said DSP module. The delay memory can be configured to store a digital signal sample at the digital signal sample input in a memory cells identified by a signal identifier at said signal-number-in input. The delay memory can also be configured to output at the digital signal sample output a digital signal sample stored in a memory cells identified by a signal identifier at the signal-number-out input.

32 Claims, 6 Drawing Sheets

Figure 6

| Time | 1 | 2 | 3 | 4 | 5 | 6 | 7 | 8 | 9 | 10 | 11 | 12 |
|---|---|---|---|---|---|---|---|---|---|---|---|---|
| 310: | A | B | C | A | B | C | A | B | C | A | B | C |
| 312: | $A_0$ | $B_0$ | $C_0$ | $A_1$ | $B_1$ | $C_1$ | $A_2$ | $B_2$ | $C_2$ | $A_3$ | $B_3$ | $C_3$ |
| 314: | B | C | A | B | C | A | B | C | A | B | C | A |
| 316: | 1 | 1 | 1 | 1 | 1 | 1 | 1 | 1 | 1 | 1 | 1 | 1 |
| 318: | | | | $A_0$ | $B_0$ | $C_0$ | $A_1$ | $B_1$ | $C_1$ | $A_2$ | $B_2$ | $C_2$ | $A_3$ | $B_3$ | $C_3$ |
| 502: | | | | | | $A_0$ | $B_0$ | $C_0$ | $A_1$ | $B_1$ | $C_1$ | $A_2$ | $B_2$ | $C_2$ | $A_3$ | $B_3$ | $C_3$ |
| 504: | | | | | | | | | $A_0$ | $B_0$ | $C_0$ | $A_1$ | $B_1$ | $C_1$ | $A_2$ | $B_2$ | $C_2$ | $A_3$ | $B_3$ | $C_3$ |
| 514: | | | | | | | | | $a_{0-3}$ | $b_{0-3}$ | $c_{0-3}$ |
| 310: | | | | | | | | | 0 | 1 | 2 | 0 | 1 | 2 | 0 | 1 | 2 | 0 | 1 | 2 |
| 312: | | | | | | | | | $A_0$ | $B_0$ | $C_0$ | $A_1$ | $B_1$ | $C_1$ | $A_2$ | $B_2$ | $C_2$ | $A_3$ | $B_3$ | $C_3$ |

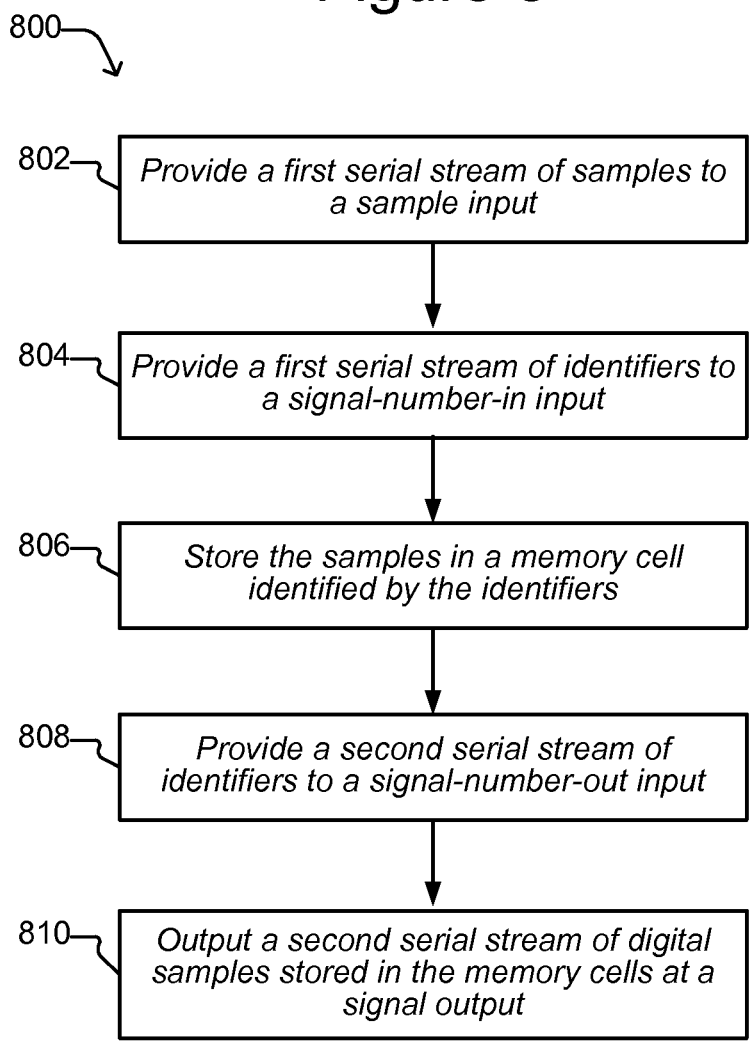

DIGITAL SIGNAL PROCESSING APPARATUS WITH A DELAY MEMORY HAVING A PLURALITY OF MEMORY CELLS AND PROCESS FOR USING SAME

BACKGROUND

Digital signal processing (DSP) can be used to manipulate data signals to modify or improve those signals. FIG. 1 illustrates an example of a prior art DSP circuit 100 that receives an input digital signal sample stream 102 of digital signal samples of a single data signal and feeds the input digital signal sample stream 102 into a DSP Module 116 to be processed in accordance with a DSP algorithm. As shown, the input digital signal sample stream 102 is first input into a delay $D_0$ 104. After a delay, the digital signal samples of the input digital signal sample stream 102 are output from the delay $D_0$ 104, as a delay output 106. Delay output 106 is then input into a second delay $D_1$ 108. As shown, a delay chain of "m" number of delays is created with the delay output of each delay of the delay chain being connected to an input of subsequent delay, which is continued to delay $D_m$ 112. Delays $D_0$ 104, $D_1$ 108, . . . $D_m$ 112 are each configured to delay a single digital signal sample for a preconfigured time. Thus, each delay $D_0$ 104, $D_1$ 108, . . . $D_m$ 112 delays a digital signal sample from the input digital signal sample stream 102 for a predetermined time, until it is passed to a subsequent delay and/or to the DSP module 116.

As further shown in FIG. 1, the input digital signal sample stream 102 and the delay output 106, 110, 114 of each delay $D_0$ 104, $D_1$ 108, . . . $D_m$ 112 are input into the DSP module 116. These inputs thus provide the DSP module 116 with a sequence of m+1 digital signal samples from the input digital signal sample stream 102, with "m" being the number of delays. Such a sequence may be used in various DSP algorithms of a DSP module 116, including but not limited to a finite impulse response (FIR) filter, an infinite impulse response filter (IIR), an equalizer, a numerically controlled oscillator (NCO), and the like.

While the illustrated DSP circuit 100 can effectively process an input digital signal sample stream 102 of a single signal, challenges arise when multiple signals need to be processed. Traditionally, one solution has been to duplicate the DSP circuit 100 for each input signal. This solution, however, is hardware intensive since it requires multiple instantiations of the same DSP circuit 100. Another solution has been to buffer each signal and process them serially in the same DSP circuit 100. While this solution does not require the duplication of hardware, it can significantly slow down the DSP processes. Accordingly, the present invention provides a DSP apparatus that is capable of timely processing multiple signals in a single instantiation of a DSP apparatus.

SUMMARY

In some embodiments, a digital signal processing (DSP) apparatus for processing a serial stream of digital signal samples of a plurality of "n" number of different signals can include a DSP module and a delay memory. The DSP module can be configured to perform a DSP algorithm on the digital signal samples of the signals as the stream of digital signal samples is provided, after a first delay, to a delay input of the DSP module. The delay memory can include "n" number of memory cells each of which can correspond to one of the "n" number of signals. Moreover, each memory cell can have sufficient storage to store one of the digital signal samples, and the delay memory can further include a digital signal sample input, a signal-number-in input, a signal-number-out input, and a digital signal sample output connected to the delay input of the DSP module. The delay memory is configured to store in one of the memory cells identified by a signal identifier at the signal-number-in input one of the digital signal samples at the digital signal sample input, and the delay memory can be further configured to output at the digital signal sample output one of the digital signal samples stored in one of the memory cells identified by a signal identifier at the signal-number-out input.

In some embodiments, a process of performing a digital signal processing (DSP) algorithm on a serial stream of digital signal samples of "n" number of different signals can include providing a serial stream of digital signal samples of the "n" number of different signals to a digital signal sample input of a delay memory. The process can also include providing to a signal-number-in input of the delay memory a first serial stream of signal identifiers where each of the signal identifiers corresponds to one of the digital signal samples in the stream of digital signal samples and identifying one of the signals to which the one of the digital signal samples corresponds. The process can also include storing the digital signal samples in one of an "n" number of memory cells of the delay memory, wherein each of the memory cells can correspond to one of the "n" number of signals, and the digital signal samples are stored in a memory cell of the "n" number of memory cells identified by the signal identifiers at the signal-number-in input. The process can further include providing to a signal-number-out input of the delay memory a second stream of signal identifiers, wherein each signal identifier of the second stream identifies a memory cell of the delay memory. The process can also include outputting to a digital signal sample output a second serial stream of digital signal samples from stored in the memory cells identified by the signal identifiers of the second stream at the signal-number-out input.

In some embodiments, a digital signal processing (DSP) system for processing a serial stream of digital signal samples of "n" number of different signals can include DSP apparatuses each of which includes a DSP module and a chain of delay memories. The DSP module can be configured to perform a DSP algorithm on digital signal samples of a first stream of digital signal samples as the stream of digital signal samples is provided, after a first delay, to a delay input of the DSP module, and the DSP module can also be configured to output a second serial stream of digital signal samples at an output. Each of delay memories of the chain of delay memories can include "n" number of memory cells, each of which can correspond to one of the "n" number of signals. Moreover, each the memory cells have sufficient storage to store one of the digital signal samples, and each of the memory cells can include a digital signal sample input, a signal-number-in input, a signal-number-out input, and a digital signal sample output connected to the delay input of the DSP module. Each delay memory can be configured to store in one of the memory cells identified by a signal identifier at the signal-number-in input one of the digital signal samples at the digital signal sample input, and each delay memory can be configured further to output at the digital signal sample output one of the digital signal samples stored in one of the memory cells identified by a signal identifier at the signal-number-out input. Each digital signal sample input of the delay memories of the chain, with the exception of a first delay memory of the chain, can be connected to a digital signal sample output of another delay memory of the chain, and the DSP apparatuses can form a chain in which the output of a DSP module of one or more of the DSP apparatus of the DSP apparatuses is connected to a digital signal sample input of a first delay memory of a chain of delay memories of one or more of the DSP apparatus of the DSP apparatuses.

BRIEF DESCRIPTION OF THE DRAWINGS

FIG. 6 is a timing diagram of data inputs and outputs of the DSP apparatus of FIG. 5 in accordance with some embodiments of the present invention.

FIG. 8 is a flowchart of a process for performing a DSP algorithm on a serial stream of digital signal samples of a plurality of signals in accordance with some embodiments of the present invention.

DETAILED DESCRIPTION OF EXEMPLARY EMBODIMENTS

Figure 1:
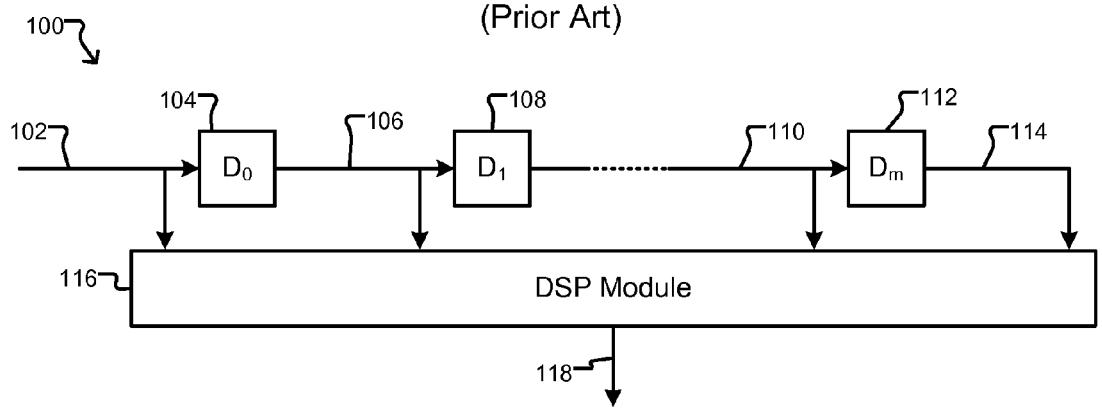
FIG. 1 is a block diagram of a prior art DSP circuit.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, the singular forms "a," "an," and "the" include plural referents unless the context clearly dictates otherwise. Thus, for example, reference to an input includes reference to one or more inputs. In addition, where reference is made to a list of elements (e.g., elements a, b, c), such reference is intended to include any one of the listed elements by itself, any combination of less than all of the listed elements, and/or a combination of all of the listed elements.

Numerical data may be expressed or presented herein in a range format. It is to be understood that such a range format is used merely for convenience and brevity and thus should be interpreted flexibly to include not only the numerical values explicitly recited as the limits of the range, but also as including all the individual numerical values or sub-ranges encompassed within that range as if each numerical value and sub-range is explicitly recited. As an illustration, a numerical range of "about 1 to 5" should be interpreted to include not only the explicitly recited values of about 1 to 5, but also include individual values and sub-ranges within the indicated range. Thus, included in this numerical range are individual values such as 2, 3, and 4 and sub-ranges such as 1-3, 2-4, and 3-5, etc. This same principle applies to ranges reciting only one numerical value and should apply regardless of the breadth of the range or the characteristics being described.

By the term "substantially" is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. As a particular example, in a digital electronics systems, two clock or other signal edges can be substantially time coincident when they are generated or triggered by a common event. The clock edges may not, however, be precisely aligned.

As used herein, the term "signal" refers to an electronic signal within a communications system. A signal can be a radio frequency signal propagating in free space or substantially confined within a signal path (e.g., a coaxial cable, waveguide, printed circuit board trace, internal wiring within an integrated circuit etc.). A signal can also be a digital signal or analog signal on a signal path. Digital signals can also be stored within digital circuits, for example in the form of particular bit patterns within a register, latch, memory, or the like. Signals can be converted between formats (e.g., between digital and analog, between stored and propagating, etc.) using various techniques (e.g., digital to analog converters, analog to digital converters, input buffers, output buffers, direct memory access controllers, etc.).

As used herein, the term "digital signal sample" refers to a digital value or set of values taken from a signal at point in time or space. A series of such digital signal samples represents a digitized form of the signal. For example, an analog signal can be sampled by an analog-to-digital converter (ADC) at specific intervals, and the resulting series of digital signal samples represents the digitally.

Figure 2:
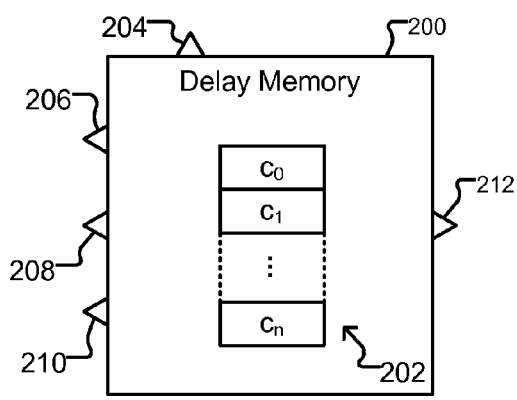
FIG. 2 is a block diagram of an example of a delay memory in accordance with some embodiments of the present invention.

FIG. 2 illustrates an example of a delay memory 200, according to some embodiments of the invention. In some embodiments, the memory 200 can replace prior delay elements in DSP circuits (e.g., delay elements $D_0, D_1 \ldots D_m$ in DSP circuit 100) and provide significant advantages over the prior art. For example, the delay memory 200 can receive and store for desired delay periods digital signal samples from a plurality of different signals. As will be seen, the delay memory 200 can allow DSP circuits such as circuit 100 in FIG. 1 to process digital signal samples from more than one signal.

As shown in FIG. 2, the delay memory 200 can include multiple memory cells 202 that each has sufficient storage to store a digital signal sample. Accordingly, the delay memory 200 can store multiple digital signal samples, rather than just a single digital signal sample, which can facilitate multiple signal processing capabilities. As such, use of the delay memory 200 can decrease the need to duplicate other portions of a DSP apparatus, such as the DSP module 320 shown in FIG. 3. Thus, use of the delay memory 200 can provide a substantial hardware savings over prior DSP circuits when used to process multiple signals.

In addition to providing the capability of storing multiple digital signal samples in a single delay device, the delay memory 200 can also be configured to operate at increased clock rates, to provide faster processing capabilities to a DSP apparatus. A discussion of such clock rates and increased processing capabilities is provided with reference to FIGS. 3 and 4.

In some embodiments, the delay memory 200 is a random access memory (RAM) device. As such, digital signal samples from the delay memory 200 can be accessed in any order. Moreover, the delay memory 200 can be embodied in an integrated circuit, as a discrete component coupled to a printed circuit board, in a software or firmware implementation, or embodied in another suitable form.

As shown in FIG. 2, the delay memory 200 can include a signal-number-in input 206, a sample input 208, a signal-number-out input 210, and a sample output 212. In some embodiments, the delay memory 200 can also have an enable input 204. Digital signal samples can be input into the sample input 208. At substantially the same time, a signal-number-in input 206 can receive a signal identifier that identifies the signal from which the digital signal sample at the sample input 208 came. The signal identifier at the signal-number-in input 206 can also identify the address of the memory cell 202 where a digital signal sample at the sample input 208 is to be stored. Another signal identifier can be received at the signal-number-out input 210. This signal identifier can identify the memory cell 202 from which a digital signal sample is to be output. The delay memory 200 can thus be configured to output at the sample output 212 a digital signal sample stored in a memory cell 202 that is identified by a signal identifier at the signal-number-out input 210. Moreover, in some embodiments, an enable input 204 provides a write enable signal to the delay memory 202 to validate the incoming digital signal sample and permit the write operation. In an example, the enable signal can be a strobe signal.

As shown, the delay memory 200 can include an "n" number of cells 202, with "n" being equal to the number of incoming signals from which the stored digital signal samples are taken. These delay cells 202 are illustrated in FIG. 2, with each memory cell 202 as memory cells $C_0, C_1, \ldots C_n$. In other embodiments, the number of delay cells 202 is an integer multiple of the number of incoming signals, "n," such as "2n," "3n," "4n," and the like. In such embodiments, the delay memory 200 can store multiple digital signal samples for each incoming signal.

In some embodiments, each memory cell 202 can correspond to a signal of the "n" number of incoming signals. As such, when an "n" number of memory cells 202 are included in the delay memory 200, a single memory cell 202 can be dedicated to a single incoming signal. Thus, each digital signal sample of an incoming signal can replace an existing digital signal sample stored in the memory cell 202 corresponding to that signal. Similarly, when, for example, a "2n" number of memory cells 202 are included in the delay memory, two memory cells 202 can be dedicated to each incoming signal. Thus, an incoming digital signal sample can replace, for example, the oldest existing digital signal sample stored in a memory cell 202 corresponding to that signal.

Figure 3:
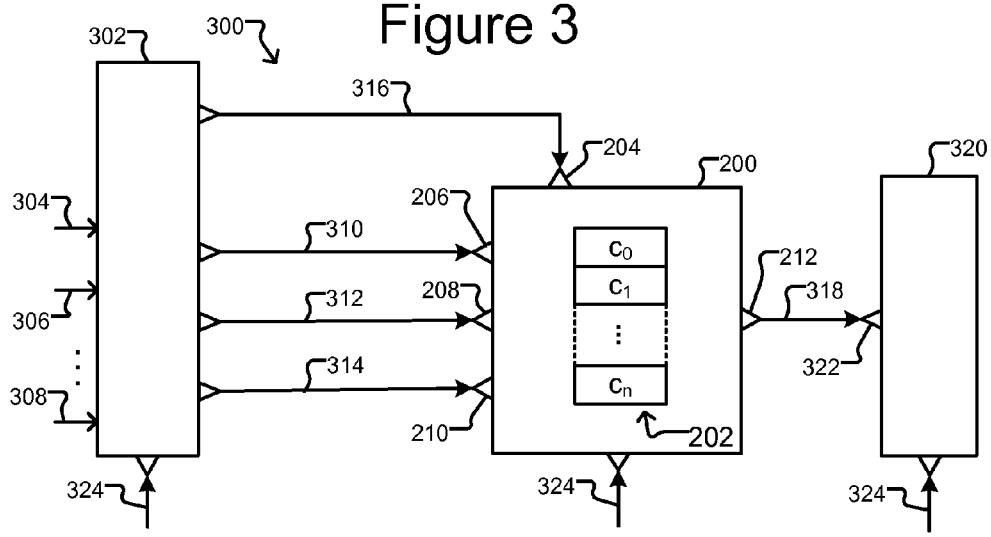
FIG. 3 is a block diagram of a DSP apparatus comprising a delay memory and a DSP module in accordance with some embodiments of the present invention.
Figure 4:
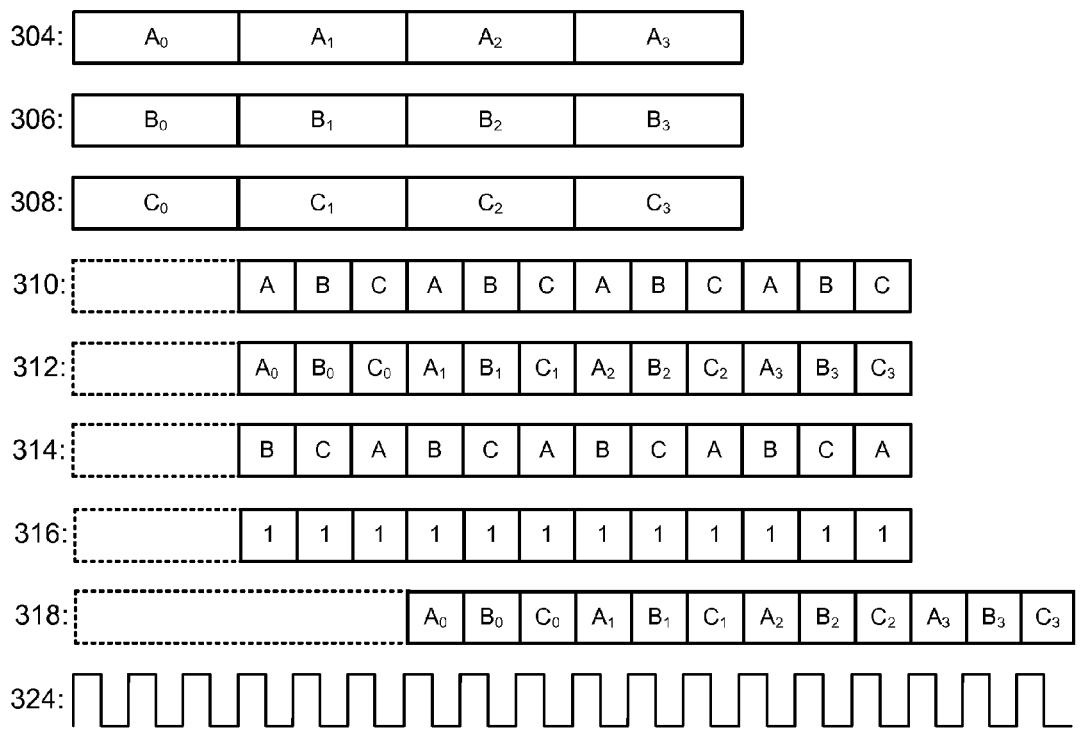
FIG. 4 is a timing diagram of data inputs and outputs of the DSP apparatus of FIG. 3 in accordance with some embodiments of the present invention.

Reference will now be made to FIGS. 3 and 4. FIG. 3 illustrates an example of a DSP apparatus 300 having the delay memory 200 of FIG. 2 and a DSP module 320 in accordance with some embodiments of the present invention. FIG. 4 illustrates an example of a timing diagram of the data inputs and output signals of the DSP apparatus 300 of FIG. 3.

As shown generally in FIG. 3, the DSP apparatus 300 includes a mixing module 302, the delay memory 200 of FIG. 2, and a DSP module 320. In some embodiments, the mixing module 302 can intake a plurality of "n" number of different signals (e.g., signal $S_A$ 304, signal $S_B$ 306, and signal $S_C$ 308) and output a serial stream of digital signal samples 312 of the plurality of "n" number of different signals, a first serial stream of signal identifiers 310, and a second stream of signal identifiers 314. These serial streams can be input into the delay memory 200. The delay memory 200 can store the digital signal samples of the serial stream of digital signal samples 312 in memory cells 202 and then, upon request, output a second serial stream of digital signal samples 318 to a DSP module 302. Each of these components, serial streams, and processes will now be described in detail with reference to both FIGS. 3 and 4.

In other embodiments, the mixing module 302 can intake a single input that contains a combination of a plurality of "n" number of different signals. For example, in some instances, the single input can include a plurality of signals received by a receiver, with at least some of the signals having different frequencies. The receiver could have sampled all of the signals together. The mixing module 302 can then take the single input and down covert it "n" number of different ways to get the "n" number of different signals.

Nevertheless, as shown in FIGS. 3 and 4, the mixing module 302 can receive a plurality of "n" number of different signals as separate signals. Only three signal $S_A$ 304, signal $S_B$ 306, and signal $S_C$ 308 are shown for simplicity of illustration. Thus, in FIGS. 3 and 4 n=3. In other embodiments, more or less than three signals are received by the mixing module 302. For example, the number of incoming signals, "n," can be between 2-30 or more than 30. For instance, 2, 4, 5, 6, 7, 8, 9, 10, more than 10, more than 15, more than 20, or more than 30 signals can be input into the DSP apparatus 300. Similarly, for simplicity of illustration, each signal is shown as having the same frequency, though it will be understood that the different signals can have different frequencies and a variety of other different parameters. Moreover, each signal can be a digital signal. As further shown in FIG. 4, each signal can be digital signal sampled, such that the signal is divided into digital signal samples. For example, signal $S_A$ 304 is shown as divided into digital signal samples $A_0, A_1, A_2,$ and $A_3$. Similarly, signal $S_B$ 306 is divided into digital signal samples $B_0, B_1, B_2,$ and $B_3$, and signal $S_C$ 308 is divided into digital signal samples $C_0, C_1, C_2,$ and $C_3$. For simplicity of illustration only four digital signal samples, digital signal samples 0-3, of each signal is shown, though it will be understood that these signals can have a much longer stream of digital signal samples.

The mixing module 302 can receive signal $S_A$ 304, signal $S_B$ 306, and signal $S_C$ 308 and output a serial stream of digital signal samples 312. As shown in FIG. 3, this serial stream of digital signal samples 312 can then be input into the sample input 208 of the delay memory 200. As shown in FIG. 4, the serial stream of digital signal samples 312 can be understood as including a serial stream of digital signal sample sets. As shown, each digital signal sample set can include a single digital signal sample from each of the "n" number of different signals. For example, a first digital signal sample set can include digital signal samples $A_0, B_0,$ and $C_0$, which include a single digital signal sample from each signal received at a given time. As shown, this first digital signal sample set is output from the mixing module 302 after a delay (delays are represented in FIG. 4 with broken lines) after these digital signal samples were received by the mixing module 302. Continuing with the illustrated example, a second digital signal sample set of the serial stream of digital signal samples 312 can include digital signal samples $A_1, B_1,$ and $C_1$, a third digital signal sample set of the serial stream of digital signal samples 312 include digital signal samples $A_2, B_2,$ and $C_2$, and a fourth digital signal sample set of the serial stream of digital signal samples 312 include digital signal samples $A_3, B_3,$ and $C_3$. As shown, in some embodiments, the digital signal samples in each digital signal sample set can be consistently ordered. Examples of such order include arranging the digital signal samples in each digital signal sample set in the same order, such as a digital signal sample from signal $S_A$ 304 being first, a digital signal sample from signal $S_B$ 306 being second, a digital signal sample from signal $S_C$ 308 being last. In other embodiments, the digital signal samples in each digital signal sample set are not ordered. Moreover, in some embodiments, the digital signal samples in the serial stream of digital signal samples 312 are not arranged in intentional digital signal sample sets, but merely output in the order they are received.

In addition to outputting the serial stream of digital signal samples 312, the mixing module 302 can simultaneously output a first serial stream of signal identifiers 310. As shown in FIG. 3, this first serial stream of signal identifiers 310 can be input into the signal-number-in input 206 of the delay memory 200. Each signal identifier of the first serial stream of signal identifiers 310 can correspond to one of the digital signal samples in the serial stream of digital signal samples 312 and can identify the signal from which the digital signal sample was taken. For example, as shown in FIG. 4, each digital signal sample in the digital signal samples in the stream of digital signal samples 312 from signal $S_A$ 304 corresponds to (e.g., is output at the same time as) a signal identifier having a value of "A." Similarly, each digital signal sample from signal $S_B$ 306 can correspond to a signal identifier having a value of "B," and each digital signal sample from signal $S_C$ 308 can correspond to a signal identifier with the value of "C." In some embodiments, as shown, each signal identifier can correspond to the digital signal sample in the serial stream of digital signal samples 312 that is output from the mixing module 302 at the same time as that signal identifier. Thus, the time relationship of the output signal identifier 310 and digital signal sample 312 can establish the correlation between these outputs. Other correlations are also contemplated.

As previously mentioned with reference to FIG. 2, the signal identifiers of the first serial stream of signal identifiers 310 at the signal-number-in input 206 of the delay memory 200 can identify a memory cell 202 of the delay memory 200. As such, the signal identifier can identify the signal from which the digital signal sample was taken. Similarly, the signal identifier of the first serial stream of signal identifiers 310 can identify the memory cell 202 of the delay memory 200 into which the digital signal sample is to be stored. For example, as shown in FIG. 4, the first signal identifier with a value of "0" can correspond to digital signal sample $A_0$. Signal identifier "0" can, for example, identify memory cell $C_0$ as the memory cell 202 of the delay memory 200 into which the digital signal sample $A_0$ is to be stored. Continuing the example, the first signal identifier with a value of "1" can correspond to digital signal sample $B_0$. This signal identifier can identify memory cell $C_1$ as the memory cell 202 of the delay memory 200 into which digital signal sample $B_0$ is to be stored. As shown, in some embodiment, each digital signal sample from a particular signal can have the same signal identifier. For example, as shown each digital signal sample from signal $S_A$ 304 can correspond to a "0" signal identifier. Thus, as mentioned, each memory cell 202 can be assigned to, or correspond to, a single signal of the "n" number of signals.

As also previously mentioned with reference to FIG. 2, when a digital signal sample from the serial stream of digital signal samples 312 arrives at the sample input 208 and a signal identifier of the first serial stream of signal identifiers 310 arrives at the signal-number-in input 206, the delay memory 200 can store the digital signal sample in the memory cell 202 identified by the signal identifier. This process can continue with each digital signal sample being stored in a memory cell 202 of the "n" number of memory cells 202 identified by the signal identifier at the signal-number-in input 206.

As further shown in FIG. 3, the mixing module 302 can output a second stream of signal identifiers 314. This second stream of signal identifiers 314 can be received at the signal-number-out input 210 of the delay memory 200. The delay memory 200 can then output a digital signal sample stored in the memory cell 202 identified by the signal identifiers of the second serial stream of signal identifiers 314 at the signal-number-out input 210. The digital signal sample can be output from sample output 212 at the next clock cycle (as shown in FIG. 3), or at a later clock cycle.

In some embodiments, the mixing module 302 and/or the delay memory 200 can be configured so that each digital signal sample in a memory cell 202 of the delay memory 200 is output prior to another digital signal sample being stored in that memory cell 202. This can avoid the loss of digital signal samples and data processing errors.

FIG. 4 further illustrates an example of outputting digital signal samples from memory cells 202 identified by a signal identifier of the second serial stream of signal identifiers 314. As shown, the second serial stream of signal identifiers 314 includes the following signal identifiers 1, 2, 0, 1 . . . These signal identifiers correspond to memory cells $C_1$, $C_2$, $C_0$, $C_1$ . . . . In this example, the first of these signal identifiers will trigger the output of a digital signal sample from memory cell $C_1$. This output may occur during the next clock cycle or during a later clock cycle. However, as shown, at that instance, there is no digital signal sample in memory cell $C_1$, so there is no output shown in the second serial stream of digital signal samples 318 during the next clock cycle. The same occurs when the second signal identifier, "2," is received since there is no digital signal sample in memory cell $C_2$ at that time. However, by the time the third signal identifier, "0," is received, digital signal sample $A_0$ has been stored in memory cell $C_0$. Thus, at the following clock cycle, $A_0$ is output from sample output 212 as the first digital signal sample in the second serial stream of digital signal sample 318, as shown. This process continues outputting stored digital signal samples, as shown in FIG. 4.

Figure 5:
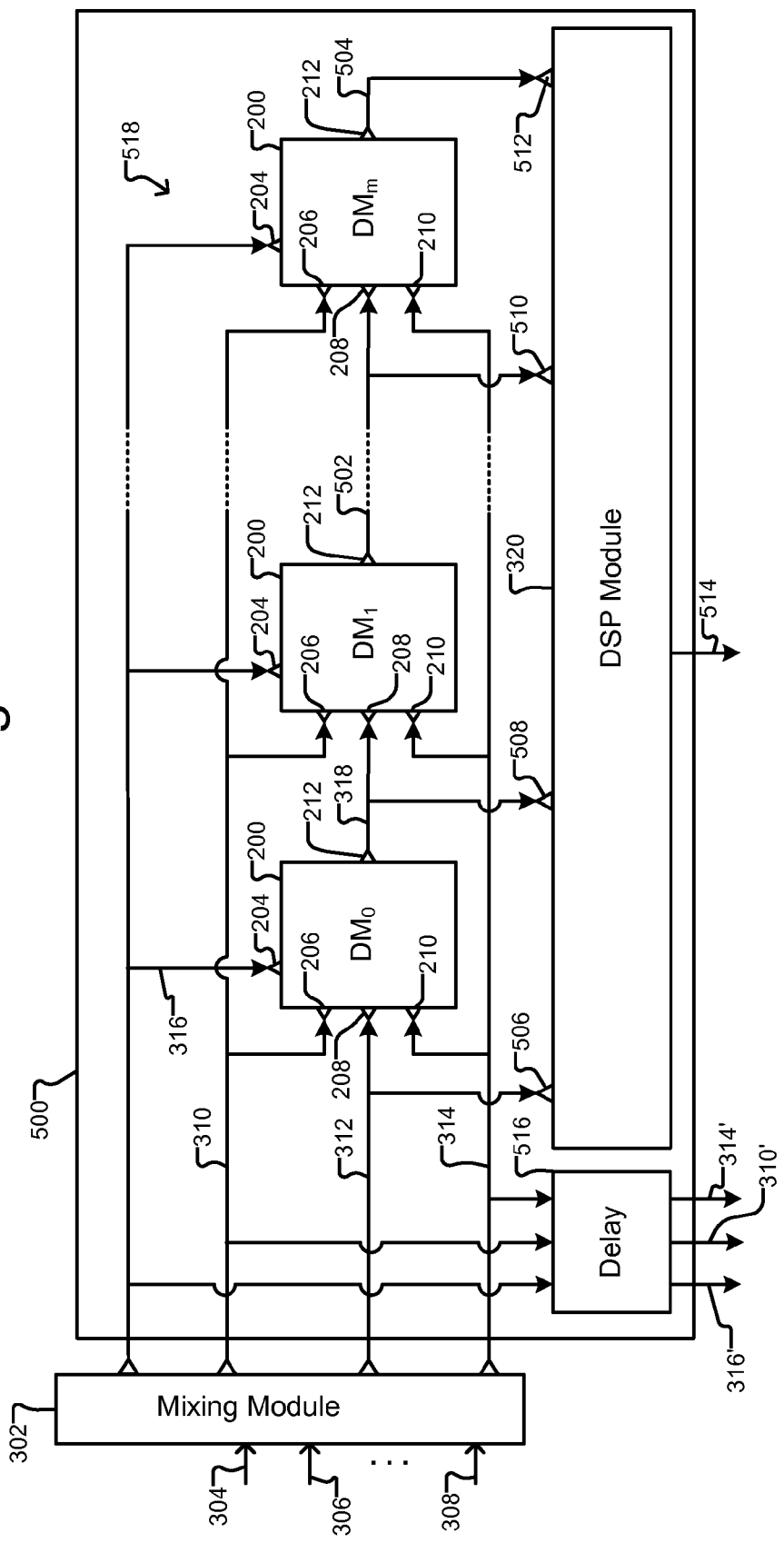
FIG. 5 is a block diagram of a DSP apparatus comprising a delay chain of delay memories and a DSP module in accordance with some embodiments of the present invention.

In some embodiments, the mixing module 302 and/or the delay memory 200 can be configured to input a digital signal sample from a particular signal at the same time that a digital signal sample from that signal is output from the delay memory 200. For example, as shown, the delay memory 200 outputs digital signal sample $A_0$ at the same time that it receives digital signal sample $A_1$. Thus, the memory cell (e.g. memory cell $C_1$) containing digital signal sample $A_0$ is rewritten with digital signal sample $A_1$ after $A_0$ is output from that memory cell. Such configurations can provide synchronization that can benefit a DSP apparatus (e.g., DSP apparatus 500 of FIG. 5) that incorporates a delay chain of delay memories 200, as shown in FIG. 5 and described below.

As shown in FIG. 3, the second serial stream of digital signal samples 318 can be input into an input 322 of a DSP module 320. The DSP module 320 can be configured to perform a DSP algorithm on the digital signal samples 318 of the plurality of signals 304, 306, and 308. The DSP module 320 can incorporate one or more DSP algorithms, including but not limited to a finite impulse response (FIR) filter, an infinite impulse response filter (IIR), an equalizer, a numerically controlled oscillator (NCO), and the like. The DSP algorithm can include one or more digital arithmetic modules. As such, the input 322 can be an input of a digital arithmetic module, such as an adder, multiplier, etc.

As shown in FIG. 3, an enable signal 316 can be coupled to the enable input 204. As shown in FIG. 4, the enable signal 316 can provide a "1" binary signal that enables the delay memory 200 to write the digital signal sample at the sample input 208 into the memory cell 202 identified by the signal identifier at the signal-number-in input 206. In some embodiments, the enable signal 316 can come from the mixing module 302 to indicate that the data is valid. This can allow signals to be processed at different rates.

As will be understood from the foregoing, the DSP apparatus 300 can incorporate a delay memory 200 configured to provide a serial stream of digital signal samples from "n" number of signals to a DSP module 320. This configuration can reduce the need for multiple instantiations of the DSP module 320 to process the "n" number of signals and can thus reduce the hardware requirements of the DSP apparatus 300. Additionally, as previously mentioned, the mixing module 302, the delay memory 200, and/or the DSP module 320 operate at a clock rate that increases processing speeds. As such, the DSP apparatus 300 can both process multiple signals with reduced hardware, while also not substantially increasing processing time. To produce such results, the clock rate of the mixing module 302, the delay memory 200, and/or the DSP module 320 can be greater than or equal to the sum of the clock rate required to process each signal of each of the "n" number of different signals. For instance, if the DSP apparatus 300 receives the three signals $S_A$ 304, $S_B$ 306, and $S_C$ 308 discussed above with respect to FIG. 3 and $S_A$ 304 and $S_B$ 306 require a clock rate of X (e.g., 2 GHz) and $S_C$ 308 requires a clock rate of Y (e.g., 1 GHz), the clock rate can be greater than or equal to 2X+Y (e.g., 5 GHz). FIG. 3 thus shows the mixing module 302, the delay memory 200, and/or the DSP module 320 can receive an input clock signal 324 (which is shown in FIG. 4).

Reference will now be made to FIGS. 5 and 6. FIG. 5 illustrates another example of a DSP apparatus 500, which incorporates a delay chain 518 of delay memories 200, a DSP module 320, and a delay element 516, in accordance with some embodiments of the present invention. FIG. 6 shows an example of a timing diagram of data inputs and outputs of the DSP apparatus 500 of FIG. 5. As with the timing diagram of FIG. 3, this timing diagrams assumes, for simplicity of illustration, that the frequencies of the incoming signal are the same and that there are only three incoming signal.

Referring to FIG. 5, the DSP apparatus 500 can include a chain 518 of "m" number of delay memories 200. Any number of delay memories 200 can be included in the delay chain 518, including for example 1-4, 1-16, 1-32, 1-64, or more delay memories 200. In some embodiments, the "m" number of delay memories 200 is equal to the number of inputs in the DSP module 320 of the DSP module 320 or is equal to one less than the number of inputs in the DSP module 320. Thus the number of inputs in the DSP module 320 can be m, (m+1), or another number.

As shown, the chain 518 of delay memories 200 can include a first delay memory DM200 that is connected to the mixing module 302 generally as shown in FIG. 3. The first delay memory $DM_0$ 200 can thus have inputs connected to outputs of the mixing module 302, as described with reference to FIG. 3. For the sake of brevity, a description of those connections will not be repeated. For all other delay memories $DM_1 \ldots DM_m$ 200 of the "m" number of delay memories 200 (i.e., all others except the first delay memory $DM_0$ 200), the sample input 208 can be connected to the sample output 212 of a prior delay memory 200 in the delay chain 518. In this manner, the second serial stream of digital signal samples 318 can be input into the second delay memory $DM_1$. A third serial stream of digital signal samples 502 can be output from the sample output 212 of the second delay memory $DM_1$ and input into the sample input 208 of the next delay memory 200. This process is repeated until an $(m^{-1})$th serial stream of digital signal samples 504 is output from the sample output 212 of the $(m^{-1})$th delay memory $DM_{m-1}$ to the sample input 208 of the mth delay memory $DM_m$ 200.

As shown, the first serial stream of signal identifiers 310 can be connected to the signal-number-in input 206 of each delay memory 200. Similarly, the second serial stream of signal identifiers 314 can be connected to the signal-number-out input 210 of each delay memory 200. By thus connecting each signal-number-in input and signal-number-out input to common sources, each delay memory 200 can be configured to substantially simultaneously output a digital signal sample from the same signal of the "n" number of signals (e.g., signal $S_A$ 304, signal $S_B$ 306, and signal $S_C$ 308), as shown and described with reference to FIG. 6. This common source can be mixing module 302 (as shown), a controller, or other suitable source.

As further shown in FIG. 5, the serial streams of digital signal samples 318, 502, 504 output from each delay memory 200 can be connected to an input of the DSP module 320, such as the illustrated first input 508, second input 510, and $(m^{-1})$th input 512. In some embodiments, as shown, the digital signal samples of the first serial stream of digital signal samples 312 can also be connected to an initial input 506 of the DSP module 320. Thus configured, the DSP module 320 can simultaneously receive a series of digital signal samples from a single signal of the "n" number of signals each at a different input of the DSP module 320.

An example of the operation of the DSP apparatus 500 of FIG. 5 will now be described with reference to FIG. 6. For ease of discussion, the example operation illustrated in FIG. 6 assumes that "m" is two—that is, that there are three delay memories 200 $DM_0$ and $DM_1$ as shown and $DM_m$ is a third delay memory $DM_2$. $DM_m$ in FIG. 5 is thus referred to as $DM_2$ in the following discussion.

It will be noted, that twelve time segments labeled "Time" are provided in FIG. 6 for the sake of explanation and do not represent qualities or attributes of the DSP apparatus 500 of FIG. 5. Moreover, an illustration of the first serial stream of signal identifiers 310, the first serial stream of digital signal samples 312, the second serial stream of signal identifiers 314, and the second serial stream of digital signal samples 318 are shown, which are similar to those of FIG. 4. A description of these signals will not be repeated.

As shown, the delay memories 200 each output a stream of digital signal samples identical to the input stream of digital signal samples after a delay. In the figure, this delay is represented by broken lines and takes up three time segments. Thus, the first serial stream of digital signal samples 312 is input into the first delay memory 200 beginning at time 1, and the second serial stream of digital signal samples 318 is output beginning at time 4. Similarly, a third serial stream of digital signal samples 502 is output beginning at time 7, and a fourth serial stream of digital signal samples 502 is output beginning at time 10.

As previously mentioned, by connecting each signal-number-in input 206 and signal-number-out output 210 of each delay memory 200, as shown in FIG. 5, to common sources, each delay memory 200 can be configured to substantially simultaneously output a digital signal sample from the same signal of the "n" number of signals. Thus, as shown at time segment 10, for the first time, all of the delay memories are loaded with stored digital signal samples. At that instance, delay memory $DM_0$ outputs digital signal sample $A_2$, delay memory $DM_1$ outputs digital signal sample $A_1$, and delay memory $DM_2$ outputs digital signal sample $A_0$—each from the same signal, signal $S_A$. In addition, at the same time, the digital signal sample $A_3$ is output from the mixing module 302 in the first serial stream of digital signal samples 312. Each of these digital signal samples can be input into separate inputs 506, 508, 510, and 512 of the DSP module 320. Thus, the delay chain 518 can be configured to simultaneously input a series of digital signal samples from a common signal into the DSP module 320, such as digital signal samples $A_0$, $A_1$, $A_2$, and $A_3$ of signal $S_A$. It will be noted that at the next time segment, segment 11, the digital signal samples $B_0$, $B_1$, $B_2$, and $B_3$ are input into inputs of the DSP module 320. Similarly, at time segment 12, the digital signal samples $C_0$, $C_1$, $C_2$, and $C_3$ are input into inputs 506, 508, 510, and 512 of the DSP module 320. This process can be continued, though not shown as continuing, to provide digital signal samples from a common signal into the DSP module 320.

As shown in FIGS. 5 and 6, the DSP module 320 can provide an output 514 based on the DSP algorithm of the DSP module 320. While the output 514 is shown as a single output, the DSP module 320 can also output multiple outputs. For simplicity, a single output 514 will be discussed hereafter. In FIG. 6 at time segment 11 this output 514 is shown as $a_{0-3}$, which represents the output of the DSP algorithm of digital signal samples $A_0$, $A_1$, $A_2$, and $A_3$. Similarly, outputs are then shown for digital signal samples from signals $S_B$ and $S_C$. As shown, the output 514 is shown as being output one time segment after the digital signal samples are input into the DSP module 320. This delay is only representative and the output 514 may occur after more time segments.

As shown in FIG. 5, a delay module 516 can provide a delay that is equal to the processing delay of the DSP module 320. One or both of the first serial stream of identifiers 310 and/or the second serial stream of identifies 312 and/or the enable signal 316 can be provided as input to the delay module 516. One or both of the delayed first serial stream of identifiers 310' and/or the second serial stream of identifies 314' output by the delay module 516 can identify which signal $S_A$ 304, $S_B$ 306, or $S_C$ 308 the output 514 of the DSP module 320 corresponds to. In addition, delayed output of the first serial stream of signal identifiers 310' and the second serial stream of digital signal samples 314' can be forwarded for use by subsequent DSP modules.

Rather than pass the enable signal 316' through the delay module 516. a delayed enable signal 316' can alternatively be passed through and/or generated as a new signal by the DSP module 320. As another alternative, the DSP apparatus 500 can produce and multiple enable signals 316. Regardless, such enable signal(s) can be provided for use in subsequence processes.

It will be understood that the DSP apparatus 500 can provide a time-shared algorithm, which can process multiple signals (or users) in a single instantiation of a DSP module 320 in a time-shared manner. Using the time-shared nature of the DSP apparatus 500, in some embodiments, the DSP apparatus 500 of FIG. 5 or the DSP apparatus 300 of FIG. 3 can be incorporated into a time-shared demodulator. For example, data communication receivers use time-shared digital demodulators to simultaneously process multi-signal (or multi-user) communications. Such digital demodulators operate in accordance with a selected modulation scheme to recover the data being conveyed by using one or more digital signal processing (DSP) algorithms. Thus, one or more embodiments of the present DSP circuit (e.g., DSP apparatus 300 of FIG. 3 or DSP apparatus 500 of FIG. 5) can be employed in a time-shared demodulator to simultaneously process multiple incoming signals using a single instantiation of a DSP circuit.

Figure 7:
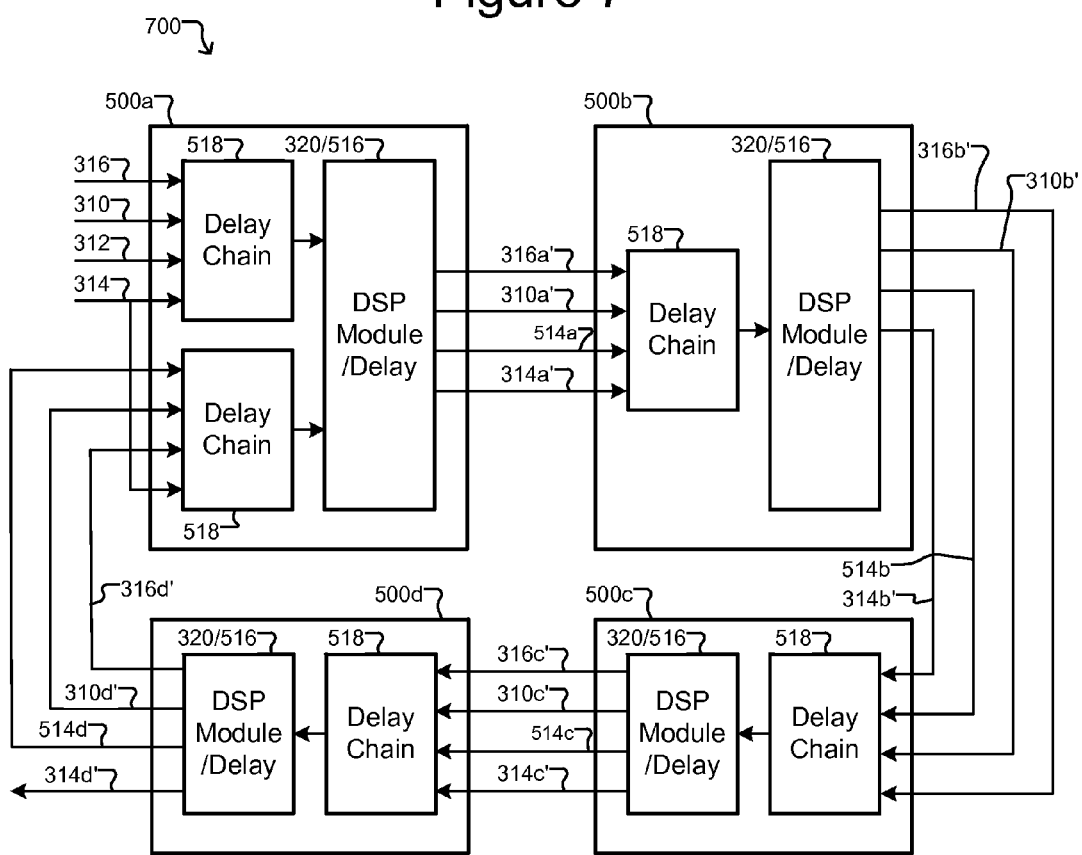
FIG. 7 is a block diagram of a DSP system comprising a plurality of DSP apparatuses in accordance with some embodiments of the present invention.

Reference will now be made to FIG. 7, which illustrates the use of multiple DSP apparatuses 500a-500d in a DSP system 700. In particular, FIG. 7 shows that multiple DSP apparatuses 500a-500d can be chained together. Moreover, as shown, these DSP apparatuses 500a-500d can be chained together to form a loop, such as a carrier recovery loop or timing recovery loop. Such a loop can form a feedback loop that provides feedback to one or more of the DSP apparatuses 500a-500d of the DSP system 700, as may be beneficial in a variety of DSP processes.

FIG. 7 illustrates four separate DSP apparatuses 500a-500d. Each of the DSP apparatuses 500a-500d can include one or more delay chains 518, similar to that described with reference to FIG. 5. Moreover, each DSP apparatus 500a-500d can include a DSP module 320 and delay 516, similar to those described with reference to FIGS. 3 and 5. In FIG. 7, each of DSP apparatuses 500b, 500c, and 500d can be configured and operate the same as the DSP apparatus 500 shown in FIG. 5. As shown, the DSP apparatus 500a can include two delay chains 518 (each of which can be configured and operate like the delay chain 518 in FIG. 5). Otherwise, the DSP apparatus 500a can be configured and operate like the DSP apparatus 500 of FIG. 5.

In the example shown in FIG. 7, the first DSP module 500a can receive an enable signal 316, a first serial stream of identifiers 310, a serial stream of samples 312, and a second serial stream of identifiers 314 generally as discussed above with respect to FIG. 5. Alternatively, instead of receiving a first serial stream of samples 312 from a mixing module (not shown), the first DSP module 500a can receive the serial stream of samples 314 output from another DSP apparatus (not shown). The first DSP apparatus 500a can process these inputs, as described with reference to FIG. 5, and output a DSP processed serial stream of samples at an output 514a, which can be like the output 514 in FIG. 5. Moreover, the first DSP apparatus 500a can also output a delayed enable signal 316a', a delayed first serial stream of identifiers 310a', and delayed second serial stream of identifiers 314a' generally as discussed above with respect to FIG. 5.

As shown, the DSP processed serial stream of samples 514a output from the DSP apparatus 500a can be provided as the serial stream of samples 514a (the 312 input) to the DSP apparatus 500b. The delayed enable signal 316a', delayed first serial stream of identifiers 310a', and second serial stream of identifiers 314a' can also be provided to the DSP apparatus 500b as shown. The DSP apparatus 500b can then process those inputs and produce a DSP processed serial stream of samples 514b as discussed above with respect to FIG. 5. The DSP apparatus 500b can also output a delayed enable signal 316b', a delayed first serial stream of identifiers 310b', and delayed second serial stream of identifiers 314b' generally as discussed above with respect to FIG. 5.

As shown, the DSP processed serial stream of samples 514b output from the DSP apparatus 500b can be provided as the serial stream of samples 514b (the 312 input) to the DSP apparatus 500c. The delayed enable signal 316b', delayed first serial stream of identifiers 310b', and second serial stream of identifiers 314b' can also be provided to the DSP apparatus 500c as shown. The DSP apparatus 500c can then process those inputs and produce a DSP processed serial stream of samples 514c as discussed above with respect to FIG. 5. The DSP apparatus 500c can also output a delayed enable signal 316c', a delayed first serial stream of identifiers 310c', and delayed second serial stream of identifiers 314c' generally as discussed above with respect to FIG. 5.

Similarly, the DSP processed serial stream of samples 514c output from the DSP apparatus 500c can be provided as the serial stream of samples 514c (the 312 input) to the DSP apparatus 500d. The delayed enable signal 316c', delayed first serial stream of identifiers 310c', and second serial stream of identifiers 314c' can also be provided to the DSP apparatus 500d as shown. The DSP apparatus 500d can then process those inputs and produce a DSP processed serial stream of samples 514d as discussed above with respect to FIG. 5. The DSP apparatus 500d can also output a delayed enable signal 316d', a delayed first serial stream of identifiers 310d', and delayed second serial stream of identifiers 314d' generally as discussed above with respect to FIG. 5.

As shown in FIG. 7, the DSP processed serial stream of samples 514d output from the DSP apparatus 500d can be fed back as the serial stream of samples 514d (the 312 input) to the DSP apparatus 500a. The delayed enable signal 316d', delayed first serial stream of identifiers 310d', and delayed second serial stream of identifiers 314d' can also be provided to the DSP apparatus 500a. It is noted, however, that, as shown in FIG. 7, the second serial stream of identifiers 314 rather than the delayed second stream of identifiers 314d' can be used by the DSP apparatus 500a. For example, the processing and delays of the DSP apparatuses 500b, 500c, and 500d may render the timing of the second stream of identifiers 314 more suitable for use at the DSP apparatus 500a than the delayed second stream of identifiers 314d'.

The DSP system shown in FIG. 7 is, of course, an example only. Many variations and different configurations are contemplated. For example, although four DSP apparatuses 500a-500d are illustrated, there can be more or fewer. As another example, the DSP apparatus 500a-500d can be interconnected in any number of different ways.

Reference will now be made to FIG. 8, which illustrates a flowchart of a process 800 (which can operate, for example, on the DSP apparatus 300 of FIG. 3, the DSP apparatus 500 of FIG. 5, or any of the DSP apparatuses 500a-500d of FIG. 7) for performing a DSP algorithm on a serial stream of digital signal samples of a plurality of signals in accordance with some embodiments of the present invention. An example of the serial stream of digital signal samples 312 taken from signals $S_A$ 304, $S_B$ 306, and $S_C$ 308 is shown in FIGS. 4 to 6. As mentioned, this first serial stream of digital signal samples 312 from the plurality of "n" number of different signals can be provided by a mixing module (e.g., mixing module 302 of FIGS. 3 and 5). The mixing module 302 can intake a plurality of "n" number of different signals and output a serial stream of digital signal samples 312 (shown in FIG. 4) of the plurality of "n" number of different signals.

In step 802 of the process 800, a first serial stream of digital signal samples of a plurality of "n" number of different signals is provided to a digital signal sample input of a delay memory (e.g., delay memory 200 of FIGS. 2, 3, and 5). For example, as shown in the example DSP apparatuses 300 and 500 of FIGS. 3 and 5, the first serial stream of digital signal samples 312 can be provided by the mixing module 302 to the sample input 208 of a delay memory 200. Moreover, as shown in FIG. 5, the first serial stream of digital signal samples can also be provided to an initial input 506 of a DSP module 320.

In step 804, a first serial stream of signal identifiers is provided to a signal-number-in input of the delay memory. Each of the signal identifiers in the serial stream of signal identifiers can correspond to one digital signal sample in the stream of digital signal samples. Each of the signal identifiers can also identify one of the signals to which the digital signal sample corresponds. As mentioned, in some embodiments, the mixing module can provide this first serial stream of signal identifiers. For example, as shown in FIG. 3, the mixing module 302 can output a serial stream of identifiers 310 to the signal-number-in input 206 of the delay memory 200. Moreover, as shown in FIG. 4, each signal identifier can identify a signal to which the digital signal sample corresponds by providing a signal number of that digital signal sample. For example, in FIG. 4, each digital signal sample in the stream of digital signal samples 312 from signal $S_A$ 304 corresponds to (e.g., is output at the same time as) a signal identifier having a value of "0." Similarly, each digital signal sample from signal $S_B$ 306 can correspond to a signal identifier having a value of "1," and each digital signal sample from signal $S_C$ 308 can correspond to a signal identifier with the value of "2."

In step 806, the digital signal samples of the first serial stream of digital signal samples can be stored in memory cells of the delay memory. The delay memory can include an "n" number of memory cells, with "n" being the number of different signals. Each of the memory cells can correspond to one of the "n" number of signals. Thus, each digital signal sample can be stored in the memory cell identified by the signal identifier at the signal-number-in input of the delay memory. For example, as shown in FIG. 4, each signal identifier of the first serial stream of identifiers 310 can designate a memory cell into which the digital signal sample of the serial stream of digital signal samples 312 is stored. Thus, the first digital signal sample $A_0$ can be stored in a memory cell corresponding to the first signal identifier "0." Similarly, the second digital signal sample $B_0$ can be stored in a memory cell correspond to the second signal identifier "1."

In step 808, a second stream of signal identifiers can be provided to a signal-number-out input of the delay memory. The signal identifiers of the second stream of signal identifiers can identify a memory cell of the delay memory from which a digital signal sample is to be output. In some embodiments, the mixing module can provide this second serial stream of signal identifiers. For example, as shown in FIGS. 3 and 5, the mixing modules 302 can output a second serial stream of signal identifiers 314 that is input into a signal-number-out input 210 of a delay memory 200.

In step 810, a second serial stream of digital signal samples can be output from a digital signal sample output of the delay memory. The digital signal samples of the second serial stream of digital signal samples can come from digital signal samples stored in the memory cells of the delay memory. These digital signal samples can be identified by the signal identifiers of the second serial stream of digital signal samples at the signal-number-out input of the memory device. For example, as shown in FIG. 4, the second serial stream of identifiers 314 can cause the delay memory to output a digital signal sample from a memory cell corresponding to the signal identifiers of this second serial stream of identifiers 314. This output is shown as taking place during the next clock cycle. Thus, as shown, the third identifier (from left to right) is a "0." During the next clock cycle, the digital signal sample $A_0$ is output from the memory cell corresponding to the "0" signal identifier. This output is shown as the first digital signal sample in the second serial stream of digital signal samples 318. It will be noted that this digital signal sample $A_0$ was stored is the first digital signal sample in the first serial stream of digital signal samples 312. It corresponded to signal identifier "0," which is the first signal identifier in the serial stream of identifiers 310. Thus, about three clock cycles prior to being output from the memory cell corresponding to signal identifier "0" it was input into the memory cell corresponding to that memory cell.

From the foregoing, it will be seen that a DSP apparatus and process is provided for processing a serial stream of digital signal samples of a plurality of "n" number of different signals. Moreover, embodiments of the DSP apparatus can be capable of timely processing multiple signals in a single instantiation of a DSP module.

Although specific embodiments and applications of the invention have been described in this specification, these embodiments and applications are exemplary only, and many variations are possible.

We claim:

1. A digital signal processing apparatus for processing a serial stream of digital signal samples of a plurality of "n" number of different signals, said apparatus comprising:
   a digital signal processor (DSP) configured to perform a digital signal processing algorithm on said digital signal samples of said plurality of signals as said stream of digital signal samples is provided, after a first delay, to a delay input of said DSP;
   a delay memory comprising "n" number of memory cells each corresponding to one of said "n" number of signals, each said memory cell having sufficient storage to store one of said digital signal samples, wherein said delay memory further comprises a digital signal sample input, a signal-number-in input, a signal-number-out input, and a digital signal sample output connected to said delay input of said DSP, and wherein said delay memory is configured to:
      store in one of said memory cells identified by a signal identifier at said signal-number-in input one of said digital signal samples at said digital signal sample input, and
      output at said digital signal sample output one of said digital signal samples stored in one of said memory cells identified by a signal identifier at said signal-number-out input; and
   a clock connected to said DSP and said delay memory, said clock configured to operate at a rate equal to or greater than a sum of frequencies of each of said "n" number of different signals.

2. The apparatus of claim 1, wherein said stream of digital signal samples is further provided to an initial input of said DSP, and wherein said digital signal sample input is connected to said initial input of said DSP.

3. The apparatus of claim 1, further comprising a mixing module connected to said delay memory, said mixing module being configured to receive said plurality of "n" number of different signals as separate signals and output said serial stream of digital signal samples.

4. The apparatus of claim 1, wherein said serial stream of digital signal samples comprises a serial stream of digital signal sample sets, each said digital signal sample set including a single digital signal sample from each of said "n" number of different signals.

5. The apparatus of claim 1, wherein said digital signal processing apparatus is a time-shared demodulator.

6. The apparatus of claim 1, wherein said delay memory is a random access memory (RAM) device.

7. The apparatus of claim 1, wherein said delay input is an input of a digital arithmetic module.

8. A digital signal processing apparatus for processing a serial stream of digital signal samples of a plurality of "n" number of different signals, said apparatus comprising:
   a digital signal processor (DSP) configured to perform a digital signal processing algorithm on said digital signal samples of said plurality of signals as said stream of digital signal samples is provided, after a first delay, to a delay input of said DSP;
   a delay memory comprising "n" number of memory cells each corresponding to one of said "n" number of signals, each said memory cell having sufficient storage to store one of said digital signal samples, wherein said delay memory further comprises a digital signal sample input, a signal-number-in input, a signal-number-out input, and a digital signal sample output connected to said delay input of said DSP, and wherein said delay memory is configured to:
      store in one of said memory cells identified by a signal identifier at said signal-number-in input one of said digital signal samples at said digital signal sample input, and
      output at said digital signal sample output one of said digital signal samples stored in one of said memory cells identified by a signal identifier at said signal-number-out input; and
   a mixing module connected to said delay memory, said mixing module being configured to receive said plurality of "n" number of different signals as separate signals and output said serial stream of digital signal samples, wherein said mixing module is further configured to output a serial stream of signal identifiers each said signal identifier corresponding to one of said digital signal samples in said stream of digital signal samples, each said signal identifier identifying one of said signals to which said one of said digital signal samples corresponds.

9. The apparatus of claim 8, further comprising a clock connected to said DSP and said delay memory, said clock configured to operate at a rate equal to or greater than a sum of frequencies of each of said "n" number of different signals.

10. A digital signal processing apparatus for processing a serial stream of digital signal samples of a plurality of "n" number of different signals, said apparatus comprising:
   a digital signal processor, (DSP) configured to perform a digital signal processing algorithm on said digital signal samples of said plurality of signals as said stream of digital signal samples is provided, after a first delay, to a delay input of said DSP; and
   a delay memory comprising "n" number of memory cells each corresponding to one of said "n" number of signals, each said memory cell having sufficient storage to store one of said digital signal samples, wherein said delay memory further comprises a digital signal sample input, a signal-number-in input, a signal-number-out input, and a digital signal sample output connected to said delay input of said DSP, and wherein said delay memory is configured to:
      store in one of said memory cells identified by a signal identifier at said signal-number-in input one of said digital signal samples at said digital signal sample input, and
      output at said digital signal sample output one of said digital signal samples stored in one of said memory cells identified by a signal identifier at said signal-number-out input,
   wherein said delay memory is a first delay memory in a chain of "m" number of delay memories, each delay memory of said chain with the exception of said first delay memory comprising "n" number of memory cells each corresponding to one of said "n" number of signals, each delay memory of said chain with the exception of said first delay memory comprising a digital signal sample input, a signal-number-in input, a signal-number-out input, and a digital signal sample output, and is configured to:
      store in one of said memory cells identified by a signal identifier at said signal-number-in input one of said digital signal samples at said digital signal sample input, and output at said digital signal sample output one of said digital signal samples stored in one of said memory cells identified by a signal identifier at said signal-number-out input.

11. The apparatus of claim 10, wherein each digital signal sample input of said delay memories of said chain, with the exception of said first delay memory of said chain, is connected to a digital signal sample output of another delay memory of said chain.

12. The apparatus of claim 10, wherein said "m" number is equal to one of a number of inputs in said DSP or one less than said number of inputs in said DSP.

13. The apparatus of claim 10, wherein said delay input of said DSP is a first delay input of a plurality of delay inputs of said DSP, and wherein each of said plurality of delay inputs is connected to a digital signal sample output of a delay memory of said chain.

14. The apparatus of claim 10, wherein each signal-number-in input of said delay memories of said chain is connected to a common source.

15. The apparatus of claim 10, wherein each signal-number-out input of said delay memories of said chain is connected to a common source.

16. The apparatus of claim 10, wherein said DSP and said chain of "m" number of delay memories comprise a first digital signal processing apparatus, wherein an output of said DSP of said first digital signal processing apparatus is connected to a chain of delay memories of a second digital signal processing apparatus, wherein said second digital signal processing apparatus includes a DSP configured to perform a digital signal processing algorithm on a digital signal samples output from a chain of delay memories of said second digital signal processing apparatus.

17. The apparatus of claim 16, further comprising one or more additional digital signal processing apparatuses coupled to said first digital signal processing apparatus and said second digital signal processing apparatus, wherein said one or more additional digital signal processing apparatuses forms a feedback loop into said first digital signal processing apparatus.

18. A process of performing a digital signal processing algorithm on a serial stream of digital signal samples of a plurality of "n" number of different signals, said process comprising:
providing a serial stream of digital signal samples of a plurality of "n" number of different signals to a digital signal sample input of a delay memory;
providing to a signal-number-in input of said delay memory a first serial stream of signal identifiers each said signal identifier corresponding to one of said digital signal samples in said stream of digital signal samples and identifying one of said signals to which said one of said digital signal samples corresponds;
storing said digital signal samples in one of an "n" number of memory cells of said delay memory, each of said memory cells corresponding to one of said "n" number of signals, said digital signal samples being stored in a memory cell of said "n" number of memory cells identified by said signal identifiers at said signal-number-in input; and
providing to a signal-number-out input of said delay memory a second stream of signal identifiers each signal identifier of said second stream identifying a memory cell of said delay memory;
outputting to a digital signal sample output a second serial stream of digital signal samples from stored in said memory cells identified by said signal identifiers of said second stream at said signal-number-out input;
providing said second stream of digital signal samples to a digital signal sample input of a second delay memory;
providing to a signal-number-in input of said second delay memory said first serial stream of signal identifiers; and
storing said digital signal samples of said second stream in one of an "n" number of memory cells of said second delay memory, each of said memory cells corresponding to one of said "n" number of signals, said digital signal samples being stored in a memory cell of said "n" number of memory cells identified by said signal identifiers at said signal-number-in input of said second delay memory.

19. The process of claim 18, further comprising receiving in a mixing module said plurality of "n" number of different signals and outputting by said mixing module said serial stream of digital signal samples.

20. The process of claim 19, further comprising outputting by said mixing module said first serial stream of signal identifiers.

21. The process of claim 18, wherein said serial stream of digital signal samples comprises a serial stream of digital signal sample sets, each said digital signal sample set including an ordered series of single digital signal sample from each of said "n" number of different signals.

22. A process of performing a digital signal processing algorithm on a serial stream of digital signal samples of a plurality of "n" number of different signals, said process comprising:
providing a serial stream of digital signal samples of a plurality of "n" number of different signals to a digital signal sample input of a delay memory;
providing to a signal-number-in input of said delay memory a first serial stream of signal identifiers each said signal identifier corresponding to one of said digital signal samples in said stream of digital signal samples and identifying one of said signals to which said one of said digital signal samples corresponds;
storing said digital signal samples in one of an "n" number of memory cells of said delay memory, each of said memory cells corresponding to one of said "n" number of signals, said digital signal samples being stored in a memory cell of said "n" number of memory cells identified by said signal identifiers at said signal-number-in input; and
providing to a signal-number-out input of said delay memory a second stream of signal identifiers each signal identifier of said second stream identifying a memory cell of said delay memory;
outputting to a digital signal sample output a second serial stream of digital signal samples from stored in said memory cells identified by said signal identifiers of said second stream at said signal-number-out input; and
providing a clock signal to a digital signal processor (DSP) and to said delay memory, said clock signal having a rate equal to or greater than a sum of frequencies of each of said "n" number of different signals.

23. The process of claim 22, further comprising providing said second serial stream to a delay input of said DSP.

24. The process of claim 23, further comprising providing said first serial stream to an initial input of said DSP.

25. The process of claim 22, further comprising providing said second stream of digital signal samples to a digital signal sample input of a second delay memory.

26. The process of claim 25, further comprising:
providing to a signal-number-in input of said second delay memory said first serial stream of signal identifiers; and
storing said digital signal samples of said second stream in one of an "n" number of memory cells of said second delay memory, each of said memory cells corresponding to one of said "n" number of signals, said digital signal samples being stored in a memory cell of said "n" number of memory cells identified by said signal identifiers at said signal-number-in input of said second delay memory.

27. The process of claim 25, further comprising:
providing to a signal-number-out input of said second delay memory said second stream of signal identifiers; and
outputting to a digital signal sample output of said second delay memory a third serial stream of digital signal samples from digital signal samples stored in said memory cells identified by said signal identifiers of said second stream at said signal-number-out input of said second delay memory.

28. The process of claim 25, further comprising providing said third serial stream to a second delay input of said DSP.

29. The system of claim 22 further comprising:
a mixing module connected to a first of said delay memories, said mixing module being configured to receive said plurality of "n" number of different signals as separate signals and output to said digital signal sample input of a first of said delay memories said serial stream of digital signal samples,
wherein said mixing module is further configured to output to said signal-number-in input of said first delay memory a serial stream of signal identifiers, each said signal identifier corresponding to one of said digital signal samples in said stream of digital signal samples, each said signal identifier identifying one of said signals to which said one of said digital signal samples corresponds.

30. The system of claim 22 further comprising a clock connected to said DSP, said clock configured to operate at a rate equal to or greater than a sum of frequencies of each of said "n" number of different signals.

31. A digital signal processing system for processing a serial stream of digital signal samples of a plurality of "n" number of different signals, said system comprising:

a plurality of digital signal processing apparatuses, each said digital processing apparatus comprising:

a digital signal processor, (DSP) configured to perform a digital signal processing algorithm on digital signal samples of a first stream of digital signal samples as said stream of digital signal samples is provided, after a first delay, to a delay input of said DSP, said DSP configured to output a second serial stream of digital signal samples at an output; and a chain of delay memories, each delay memory comprising "n" number of memory cells each corresponding to one of said "n" number of signals, each said memory cell having sufficient storage to store one of said digital signal samples, wherein said delay memory further comprises a digital signal sample input, a signal-number-in input, a signal-number-out input, and a digital signal sample output connected to said delay input of said DSP, and wherein said delay memory is configured to:

store in one of said memory cells identified by a signal identifier at said signal-number-in input one of said digital signal samples at said digital signal sample input, and output at said digital signal sample output one of said digital signal samples stored in one of said memory cells identified by a signal identifier at said signal-number-out input, wherein each digital signal sample input of said delay memories of said chain, with the exception of a first delay memory of said chain, is connected to a digital signal sample output of another delay memory of said chain;

wherein said plurality of digital signal processing apparatuses form a chain in which the output of a DSP of one or more of said digital signal processing apparatus of said plurality of digital signal processing apparatuses is connected to a digital signal sample input of a first delay memory of a chain of delay memories of one or more of said digital signal processing apparatus of said plurality of digital signal processing apparatuses.

32. The system of claim 31, wherein said plurality of digital signal processing apparatuses forms a feedback loop.

* * * * *